(12) United States Patent
Pendharkar et al.

(10) Patent No.: US 7,238,986 B2
(45) Date of Patent: Jul. 3, 2007

(54) ROBUST DEMOS TRANSISTORS AND METHOD FOR MAKING THE SAME

(75) Inventors: Sameer Pendharkar, Dallas, TX (US); Ramanathan Ramani, Richardson, TX (US); Taylor R. Efland, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 171 days.

(21) Appl. No.: 10/837,918

(22) Filed: May 3, 2004

(65) Prior Publication Data

US 2005/0253191 A1 Nov. 17, 2005

(51) Int. Cl.
*H01L 29/76* (2006.01)
(52) U.S. Cl. .................. 257/336; 257/327; 257/335
(58) Field of Classification Search ........... 257/335, 257/336, 339, 492
See application file for complete search history.

(56) References Cited

U.S. PATENT DOCUMENTS

| | | |
|---|---|---|
| 5,406,110 A | 4/1995 | Kwon et al. |
| 5,501,994 A | 3/1996 | Mei |
| 5,736,766 A | 4/1998 | Efland et al. |
| 5,981,997 A * | 11/1999 | Kitamura .................. 257/335 |
| 6,071,768 A | 6/2000 | Duvvury et al. |
| 6,211,552 B1 | 4/2001 | Efland et al. |
| 6,225,673 B1 * | 5/2001 | Pendharkar et al. ........ 257/502 |
| 6,258,674 B1 * | 7/2001 | Kwon et al. ............... 438/286 |
| 6,372,586 B1 | 4/2002 | Efland et al. |
| 6,424,005 B1 | 7/2002 | Tsai et al. |
| 6,441,431 B1 | 8/2002 | Efland et al. |
| 6,468,837 B1 | 10/2002 | Pendharkar et al. |
| 6,469,346 B1 * | 10/2002 | Kawaguchi et al. ........ 257/336 |
| 6,828,628 B2 * | 12/2004 | Hergenrother et al. ...... 257/335 |
| 6,890,804 B1 * | 5/2005 | Shibib et al. .............. 438/163 |
| 6,894,349 B2 * | 5/2005 | Beasom .................... 257/343 |
| 6,911,694 B2 * | 6/2005 | Negoro et al. ............. 257/336 |

* cited by examiner

*Primary Examiner*—Wai-Sing Louie
*Assistant Examiner*—Mursalin B. Hafiz
(74) *Attorney, Agent, or Firm*—Rose Alyssa Keagy; W. James Brady; Frederick J. Telecky, Jr.

(57) ABSTRACT

Extended-drain MOS transistor devices and fabrication methods are provided, in which a drift region of a first conductivity type is formed between a drain of the first conductivity type and a channel. The drift region comprises first and second portions, the first portion extending partially under a gate structure between the channel and the second portion, and the second portion extending laterally between the first portion and the drain, wherein the first portion of the drift region has a concentration of first type dopants higher than the second portion.

26 Claims, 8 Drawing Sheets

ROBUST DEMOS TRANSISTORS AND METHOD FOR MAKING THE SAME

FIELD OF INVENTION

The present invention relates generally to semiconductor devices and more particularly to extended-drain MOS transistor devices and fabrication methods for making the same.

BACKGROUND OF THE INVENTION

Power semiconductor products are often fabricated using N or P channel drain-extended metal-oxide-semiconductor (DEMOS) transistor devices, such as lateral diffused MOS (LDMOS) devices, for high power switching applications. DEMOS devices advantageously combine short-channel operation with high current handling capabilities, relatively low drain-source on-state resistance (Rdson), and the ability to withstand high blocking voltages without suffering voltage breakdown failure. Breakdown voltage is typically measured as drain-to-source breakdown voltage with the gate and source shorted together (BVdss), where DEMOS device designs often involve a tradeoff between breakdown voltage BVdss and Rdson. In addition to performance advantages, DEMOS device fabrication is relatively easy to integrate into CMOS process flows, facilitating use in devices where logic, low power analog, or other circuitry is also to be fabricated in a single integrated circuit (IC).

N-channel DEMOS transistors are asymmetrical devices in which a p-type channel region is typically formed in a p-well between an n-type source and an extended n-type drain. Low n-type doping on the drain side provides a large depletion layer with high blocking voltage capability, wherein the p-well is typically shorted to the source by a back-gate connection to prevent the p-well from floating, thereby stabilizing the device threshold voltage (Vt). To address high breakdown voltage requirements, the device drain region is spaced from the gate to provide a drift region or drain extension in the semiconductor material therebetween. The drain extension or drift region between the channel and the drain is typically made (implanted or diffused) to a relatively shallow depth with only moderate or light doping, and is sometimes referred to as a reduced surface field (RESURF) implant region. The spacing of the drain and the gate spreads out the electric fields in operation, thereby increasing the breakdown voltage rating of the device (higher BVdss). However, the drain extension increases the resistance of the drain-to-source current path (Rdson), whereby DEMOS device designs often involve a tradeoff between breakdown voltage BVdss and Rdson.

DEMOS devices have been widely used for power switching applications requiring blocking voltages in the range of 20-60 volts, and current carrying capability in the range of about 1-3 amps or higher, particularly where a solenoid or other inductive load is to be driven. In one common configuration, two or four n-channel DEMOS (DENMOS) devices are arranged as a half or full "H-bridge" circuit to drive an inductive load. In a half H-bridge arrangement, two DENMOS transistors are coupled in series between a supply voltage VCC and ground with a load coupled from an intermediate node between the two transistors to ground. In this configuration, the transistor between the intermediate node and ground is referred to as the ""low-side" transistor and the other transistor is a "high-side" transistor.

FIGS. 1A and 1B illustrate a portion of a conventional driver IC that includes drain-extended MOS devices to drive an external inductive load. FIG. 1A illustrates a full H-bridge device 2 powered by a DC supply voltage VCC. The device 2 includes four DENMOS devices T1-T4 having corresponding sources S1-S4, drains D1-D4, and gates G1-G4, respectively. The transistors are arranged as two pairs of high and low-side drivers with the load coupled between the intermediate nodes of the two pairs, thereby forming an "H-shaped" circuit. On the left side of the H-bridge, a low-side driver T1 and a high-side driver T2 are coupled in series between the supply voltage VCC and ground, and the other pair T3 and T4 are similarly connected (high and low). The transistor T2 has a drain D2 coupled to VCC and a source S2 coupled with an intermediate node N1 at the load. The low-side transistor T1 has a drain D1 coupled to the node N1 and a source S1 coupled to ground. The node N1 between the transistors T1 and T2 is coupled to a first terminal of an inductive load and the other load terminal is coupled to the other transistor pair T3 and T4, wherein the load is typically not a part of the device 2. The high and low side transistor gates are controlled so as to drive the load in alternating fashion. When the transistors T2 and T4 are on, current flows through the high-side transistor T2 and the load in a first direction (to the right in FIG. 1A), and when the transistors T3 and T1 are both on, current flows through the load and the low-side transistor T1 in a second opposite direction.

As shown in FIG. 1B, the transistors T1 and T2 are fabricated as DENMOS devices, wherein parasitic diodes and NPN transistors are incidentally formed therein (illustrated in dashed lines for the low-side device T1). The low-side driver T1 includes a parasitic back-gate diode D1 and a parasitic NPN transistor 44. The diode D1 has an anode connected to the source S1 and a cathode connected to the drain D1. The parasitic NPN transistor 44 has an emitter coupled to the node N1 between the low and high-side transistors T1 and T2, as well as a base and collector coupled to ground. The device 2 is formed in a P-epi silicon substrate 4 with a p+ doped contact region 52 disposed at an upper surface of the substrate 4. Two n+ buried layers (NBL) 8a and 8b in the substrate 4 provide isolation for the low and high-side devices T1 and T2, respectively, where the buried layer 8b for the high side device T2 is coupled to VCC and layer 8a of the low-side device T1 is grounded.

Upper epitaxial portions of the substrate 4 are p-doped to form P-BASE regions 6a and 6b within the isolation layers 8a and 8b, respectively. A p-well 18a is formed within the P-BASE 6a, and a source S1 is formed in the well 18a, including n+ portions 64a and a p+ back gate 65a. An n+ drain 56a (D1) is formed in the P-BASE 6a, which is spaced from the p-well 18a, and an n-RESURF region (e.g., drain extension or drift region) 22a extends from a channel portion of the P-BASE 6a under a gate 42a (G1) to the drain 56a. An oxide layer 71 is provided on the drift region 22a, and the gate 42a operates to provide a field in the underlying p-doped channel. The high-side driver T2 includes similar structures including a drain 56b (coupled to VCC), a drift region 22b, a gate 42b, an oxide layer 71b, as well as a source 64b and a back-gate 65b formed in a p-well 18b, where the circuit connections of the n-buried layers 8a and 8b, as well as of the transistors T1 and T2 from FIG. 1A are shown in dashed lines in FIG. 1B.

As seen in FIG. 1B, the parasitic back-gate diode D1 results from the PN junction between the P-BASE region 6a and the drift region 22a. Moreover, the provision of the isolation buried layer 8a in the low-side device T1 leads to formation of the parasitic NPN transistor 44 with an emitter in the n-drift region 22s, a base in the P-BASE 6a, and a collector in the n-buried layer 8a. For low-side devices, such as the DENMOS device T1, the buried layer 8a advantageously isolates the drain 56a, to help minimize minority injection into the substrate 4. Also of note in FIG. 1B is the very slight overlap of the gate 42a and the thin RESURF drift region 22a, which is only about 0.2 to 0.3 um or less in conventional thin RESURF DEMOS devices. This small spatial overlap causes the gate-to-drain capacitance (Cgd) to be small for conventional thin RESURF DEMOS devices, advantageously allowing fast switching operation. However, the small overlap distance may lead to significant degradation in device parameters due to hot carrier injection into the drain-side end of the gate. Such hot carrier degradation reduces the reliability and thus lowers the useful life of the DEMOS T1. Accordingly, there is a need for improved drain-extended transistors with better performance reliability.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention provides improved extended-drain MOS (DEMOS) transistor devices and fabrication methods for making the same, in which a drift region (e.g., drain extension or RESURF region) of a first conductivity type is formed between a drain of the first conductivity type and a channel. The drift region comprises first and second portions, where the first portion extends partially under a gate structure between the channel and the second portion, and the second portion extends laterally between the first portion and the drain.

In accordance with one aspect of the invention, drain-extended MOS transistors are provided, in which the drift region has a decreasing dopant concentration profile along the direction from the gate to the drain, wherein the first portion of the drift region has a concentration of first type dopants higher than the second portion. This higher doped first portion aids in reducing degradation due to hot carrier injection in the gate oxide, and thus improves device reliability without significantly changing the on-state resistance Rdson or the breakdown voltage performance of the device.

In another aspect of the invention, the first portion of the drift region extends further underneath the drain-side gate edge than in conventional thin RESURF DEMOS devices to further aid in reducing degradation due to hot carrier injection. In one implementation illustrated and described below, the first portion of the drift region extends beneath the gate structure by about 0.5 um or more. In addition, the first drift region portions of the invention may be formed deeper than the second portions, with opposite type dopants being provided below the first portion to avoid shorting the drift region to an underlying buried layer or to avoid unnecessary increase in the epitaxial thickness. The transistors of the invention may be n or p channel devices, and may include buried layers for drain isolation. The transistors may be employed in any application, and may find particular utility as low-side drivers in full or half-bridge driver circuits.

Further aspects of the invention provide methods for fabricating DEMOS transistors having drift regions comprising first and second portions, in which the first portion has a higher dopant concentration than the second portion, and/or in which the first portion extends beneath the gate structure by about 0.5 um or more. The methods involve forming a first portion of a drift region of a first conductivity type to a first depth in the semiconductor body, and oppositely doping a region under the first portion. A gate structure is formed with a first lateral end that extends at least partially over the first portion of the drift region, and a second drift region portion is formed that connects to the first portion and extends to a drain, where the second drift region portion has a second depth.

In one aspect of the invention, the first portion is formed such that the dopant concentration thereof is greater than that of the second portion, thereby providing a decreasing drift region dopant concentration profile along a direction from the gate to the drain. Alternatively or in combination, the gate structure and the first drift region portion are formed such that the gate extends at least partially over the first lateral end of drift region by a first lateral distance of about 0.5 um or more according to another aspect of the invention. Moreover, the drift region may be formed to have a lateral depth profile, wherein the first portion (e.g., near the channel end of the drift region) extends deeper than does the second portion (e.g., near the drain end).

In one exemplary implementation of the methods of the invention, the first drift region portion is implanted in the semiconductor body using a mask that exposes the surface above the prospective first portion and covers the outlying areas. Dopants of opposite conductivity type are implanted (e.g., a base region implant) to a depth below the first portion implant using a mask that covers the surface above the prospective first portion, wherein the base region implant and the first drift region portion implants may be performed in any order. In this example, dopants from both these implants are concurrently diffused by thermal annealing, wherein the deeper base dopants diffuse laterally beneath the first portion, thereby limiting the downward diffusion of the drift region dopants and preventing shorting to an underlying buried layer implant.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
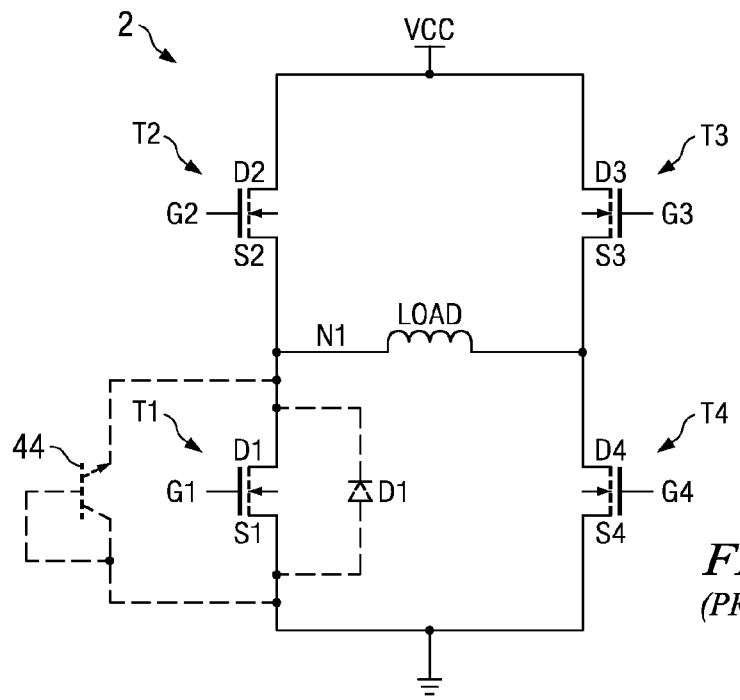
FIG. 1A is a schematic diagram illustrating a full H-bridge circuit device for driving a load using two pairs of conventional high and low-side drain-extended MOS devices.

One or more implementations of the present invention will now be described with reference to the attached drawings, wherein like reference numerals are used to refer to like elements throughout, and wherein the illustrated structures are not necessarily drawn to scale. The invention provides drain-extended MOS transistors and fabrication methods therefor, in which a drift region of a first conductivity type comprises first and second portions, the first portion extending partially under a gate structure between the channel and the second portion, and the second portion extending laterally between the first portion and the drain. In the examples presented below, the various aspects of the invention are illustrated and described with respect to an exemplary n-channel drain extended MOS (DENMOS) device fabricated using p-type silicon substrates with a p-type epitaxial layer formed thereover. However, the invention is not limited to the illustrated examples, wherein NMOS or PMOS transistors may be fabricated using any type of substrate, including but not limited to silicon or SOI wafers, and wherein all such variants are contemplated as falling within the scope of the invention and the appended claims.

Figure 2A:
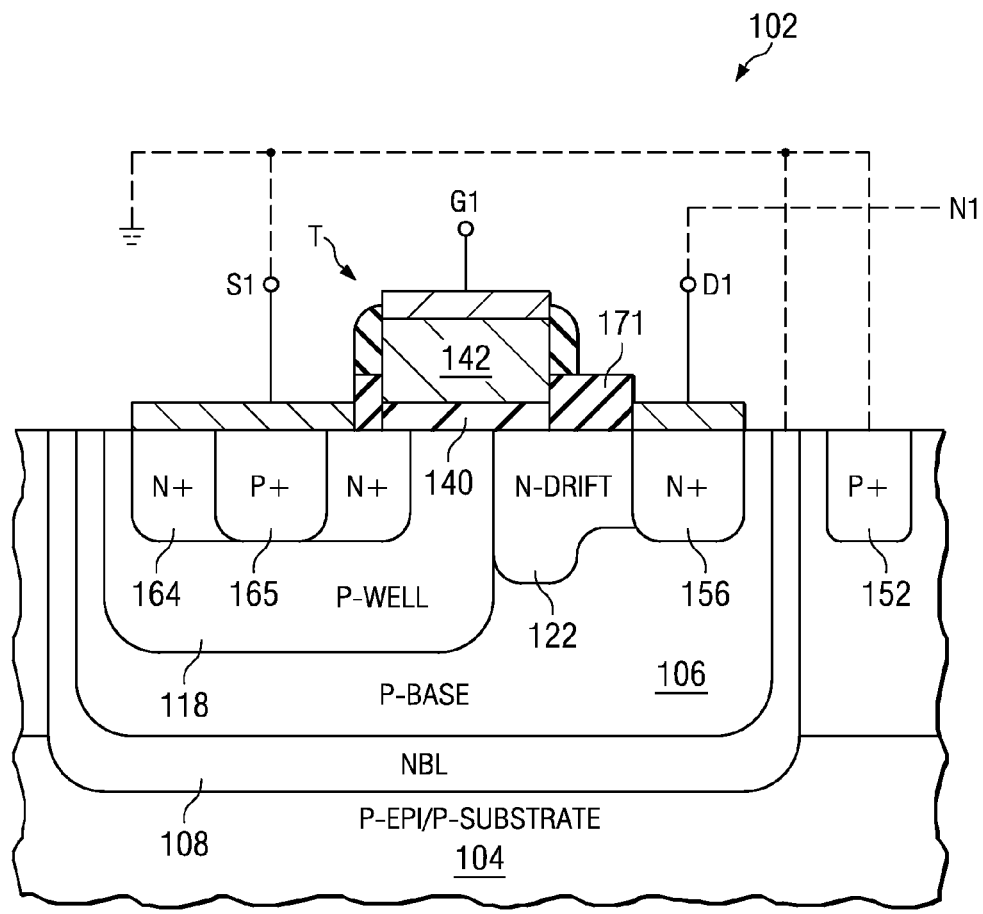
FIGS. 2A and 2B illustrate an exemplary DENMOS transistor having a drift region in accordance with several aspects of the present invention.
Figure 2B:
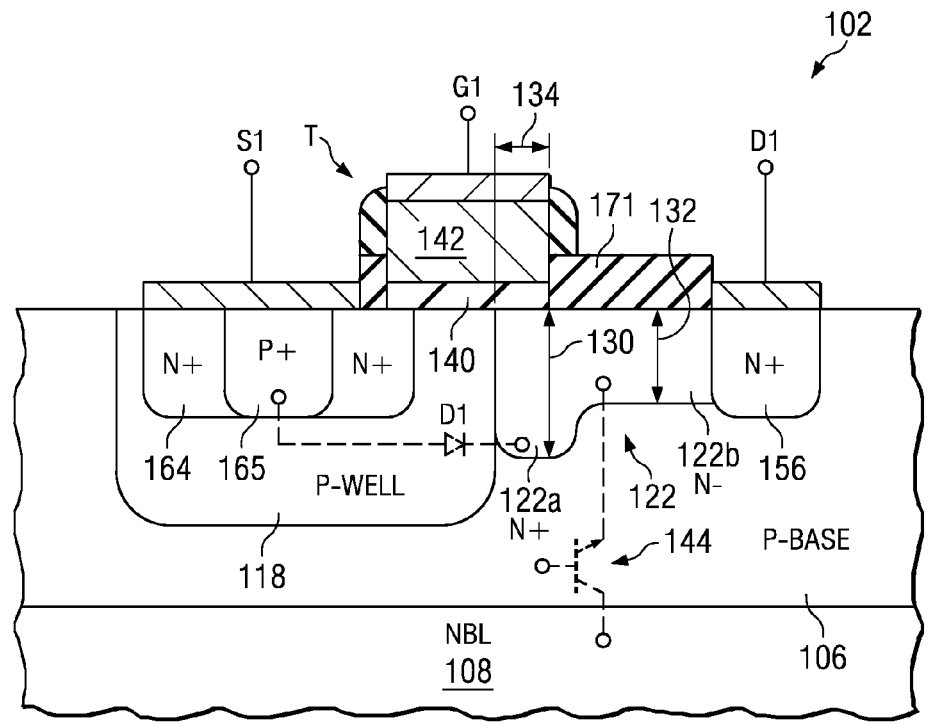

Referring initially to FIGS. 2A and 2B, a portion of an exemplary semiconductor device 102 is illustrated, in which an isolated DENMOS low-side driver transistor T is formed on/in a semiconductor body 104. The exemplary device comprises a p-doped silicon substrate 104 over which epitaxial silicon is formed to a thickness of about 4-10 um. All or a portion of the epitaxial silicon is provided with p-type dopants (e.g., B, Ga, In, etc.) to form a p-type base region (P-BASE) 106 above an n-type buried layer (NBL) 108. The n-buried layer 108 may be formed of any suitable n-type dopants (e.g., P, As, Sb, etc.) by any suitable techniques, for example, through implantation of n-type dopants deep within the semiconductor body 104 (substrate/epi), and is preferably formed prior to growth of the epitaxial silicon. Subsequent (e.g., vertically extending) dopant diffusions or other conductive means may be formed as illustrated in FIG. 2A or otherwise to provide for electrical connection of the n-buried layer 108 to a device ground as shown in dashed lines in FIG. 2A for a low-side driver application. Alternatively, the n-buried layer 108 may be connected to a supply voltage (e.g., VCC) for use as a high-side driver.

The transistor T comprises a p-well or p-body region 118 formed in the p-base 106, wherein a portion of the p-well 118 operates as a transistor channel. An n-doped source 164 region (S1) is formed in the p-well 118 along with a p-doped back-gate 165. A gate structure (G1) is formed above the channel, including a thin gate dielectric 140 and a gate electrode 142 having first and second lateral ends, wherein the n-doped source 164 extends slightly beneath the second end of the gate dielectric 140 and the channel portion of the p-well 118 extends at least partially under the gate structure. An n-doped drain 156 (D1) is formed in the epitaxial silicon laterally spaced from the gate and the channel, and an n-doped drift region 122 is formed in the semiconductor body between the drain 156 and the channel portion of the p-well 118.

As illustrated in FIG. 2B, the drift region comprises a first portion 122a (FIG. 2B) having a first depth 130, and a second portion 122b of a smaller second depth 132. In the illustrated embodiment, the first depth 130 is about 0.7 to 1.0 um and the second depth 134 is about 0.2-0.4 um. The first portion 122a is located at a first lateral end of the drift region 122 and extends at least partially under the first lateral end of the gate structure by a first lateral distance 134, and the second portion 122b is located at a second opposite lateral end of the drift region 122.

In accordance with one aspect of the invention, the lateral distance 134 is about 0.5 um or more, such as about 0.6 um or more and about 1.0 um or less in one embodiment. The inventors have appreciated that extending the modified drift region 122 to this length 134 under the gate edge may mitigate hot carrier degradation of the gate dielectric 140, thus extending the useful life of the device 102, as discussed further below.

In accordance with another aspect of the invention, the concentration of n-type dopants in the drift region 122 is such that the first portion 122a comprises a first concentration of n-type dopants at a given depth that is greater than a second concentration at the same depth in the second portion 122b. In the illustrated example, the first concentration is about 4.5E16 to 6.5E16 cm$^{-3}$ at a depth of about 0.4 um and the corresponding concentration in the second portion 122b is about 2.0E16 to 4E16 cm$^{-3}$. This provides a drift region dopant concentration profile that is high in the first portion 122a under the gate edge and becomes lower in the second portion 122b along the direction from the gate structure to the drain 156.

In this regard, the inventors have appreciated that simply increasing the drift region dopant content uniformly along the entire lateral length of a conventional drift region (e.g., drift region 22a in FIG. 1B above) would have significant adverse impact on the transistor breakdown voltage (Bvdss) vs. Rdson performance tradeoff for a particular design. In the current invention, localizing the extra drift region dopants in the first portion 122a to the area proximate to and under the gate edge maintains a relatively long, lightly doped first drift region portion 122b to minimize the adverse impact on breakdown voltage, while advantageously reducing the amount of damage due to hot carrier injection at the edge of the gate.

Thus, the exemplary drift region 122 extends laterally farther under the gate structure than in conventional thin RESURF DENMOS devices, extends deeper at the first end of the drift region than in prior devices, and also has a higher dopant concentration under the gate structure than in conventional RESURF DENMOS transistors. In addition, the p-base region 106 is p-doped such that a portion of the semiconductor body (e.g., the p-base 106) under the first drift region portion 122a has a p-type dopant concentration of about 4E16 or more, such as about 4E16 to 6E16 cm$^{-3}$, which is a higher p-type dopant concentration than in previous devices. In the illustrated device 102, the combination of the modified drift region 122 with isolation by virtue of the n-buried layer 108 and the extra doping of the p-base region 106 has been found to provide improved reverse recovery performance (e.g., reduced peak back-gate diode current) in low-side driver applications, together with improved device reliability by mitigating degradation due to hot carrier injection into the gate, as discussed further hereinafter.

As illustrated in FIG. 2B, a parasitic back-gate diode D1 is formed by the PN junction between the p-base 106 and the drift region portion 122a, and a parasitic NPN transistor 144

(e.g., vertical NPN) is formed with an emitter in the first portion 122a of the drift region 122, a base in the p-base 106, and a collector in the buried layer 108. The inventors have appreciated that the provision of additional dopants to the first portion 122a and the extension thereof further under the gate structure helps to reduce hot carrier degradation, and adding extra p-type dopants to the p-base region 106 below the first drift region portion 122a assists in localizing the spatial extent or boundaries of the first portion 122a, without significantly degrading the reverse recovery performance of the back-gate diode D1, without significantly degrading the voltage breakdown capability, without significant penalty in gate-drain capacitance Cgd, and without shorting the drift region 122 to the buried layer 108. In this regard, for a low-side driver implementation of the transistor T, the n-buried layer 108 is grounded, such that it is important that the drift region 122 be separated from the buried layer 108 to avoid shorting the source S1 and the drain D1.

In operation of the transistor T in a pulsed switching application for driving an inductive load (e.g., such as a low-side driver transistor in the H-bridge circuit described in FIG. 1A above), the transistor T is coupled with the source S1 and the isolating n-buried layer 108 grounded. As shown in FIG. 1A, when the high-side driver is turned on, current builds up in the inductive load. Once the high-side driver turns off, however, the inductive load current conducts through the low side driver back-gate diode D1 (e.g., in the direction from the source S1 to the drain D1). Reverse recovery is observed in the diode D1 when the high-side driver is again turned on, wherein reducing the reverse recovery current (e.g., the back-gate diode current) is desirable to reduce device switching losses and electro-magnetic interference (EMI), particularly in high efficiency applications such as DC to DC converters.

The inventors have appreciated that reverse recovery current is less in isolated low-side drivers, such as the exemplary DENMOS transistor T of FIGS. 2A and 2B with a grounded n-buried layer 108, compared with non-isolated devices. Further, the provision of higher p-type dopant concentrations in the p-base region 106 is also believed to aid in reducing the back-gate diode reverse recovery current for non-isolated low-side drivers. Although a reverse relationship is seen in isolated DENMOS devices, wherein increasing the p-base doping may marginally degrade the reverse recovery performance, the inventors have appreciated that the tradeoff of more p-base doping in combination with the n-buried layer 108 and the deeper and higher doped first drift region 122a provides significantly better overall performance compared with non-isolated devices.

In the exemplary transistors of the present invention, moreover, the additional p-base dopant concentration and location advantageously aids in controlling the spatial profile and ultimate depth of the first portion 122a of the drift region to guard against excessive lateral diffusion of the n-type dopants thereof, and also prevents shorting to the buried layer 108. Thus, in the examples illustrated herein, the p-base 106 is initially implanted deeper and to a higher concentration than in prior devices, using a mask to prevent initial p-type dopants from being implanted beneath the first region 122a. This provides a lateral barrier to excessive lateral diffusion of n-type dopants from the first portion 122a. In addition, the p-base dopants beneath the first depth 130 will diffuse laterally into the area of the p-base 106 below the first portion 122a, thereby inhibiting excessive downward diffusion of the n-type drift region dopants beyond the desired first depth 130. This control over the depth 130 avoids having to increase the epitaxial silicon thickness in the device 102 and avoids shorting the drift region 122 to the n-buried layer 108.

The inventors have appreciated that reverse recovery performance is affected by the vertical parasitic NPN transistor 144, wherein higher p-base doping and the provision of the n-buried layer 108 can substantially reduce the peak reverse recovery current. While not wishing to be tied to any particular theory, it is believed that higher dopant concentration in the p-base region 106 reduces electron diffusion length therein and also increases hole injection in the n-drift region 122, both of which help to decrease reverse recovery current. In reverse recovery, the vertical NPN 144 operates in weak saturation, due to significant debiasing in the p-well 118 and the p-base 106. This reduces hole current supplied by the P+ back gate contact 165, and also provides a path to remove injected electrons from the p-base 106, resulting in reduced peak reverse recovery current. In this regard, since the reverse recovery performance is believed to be affected by the gain of the vertical parasitic transistor 144, increasing the NPN gain will help reduce the peak reverse recovery current levels.

Figure 1B:
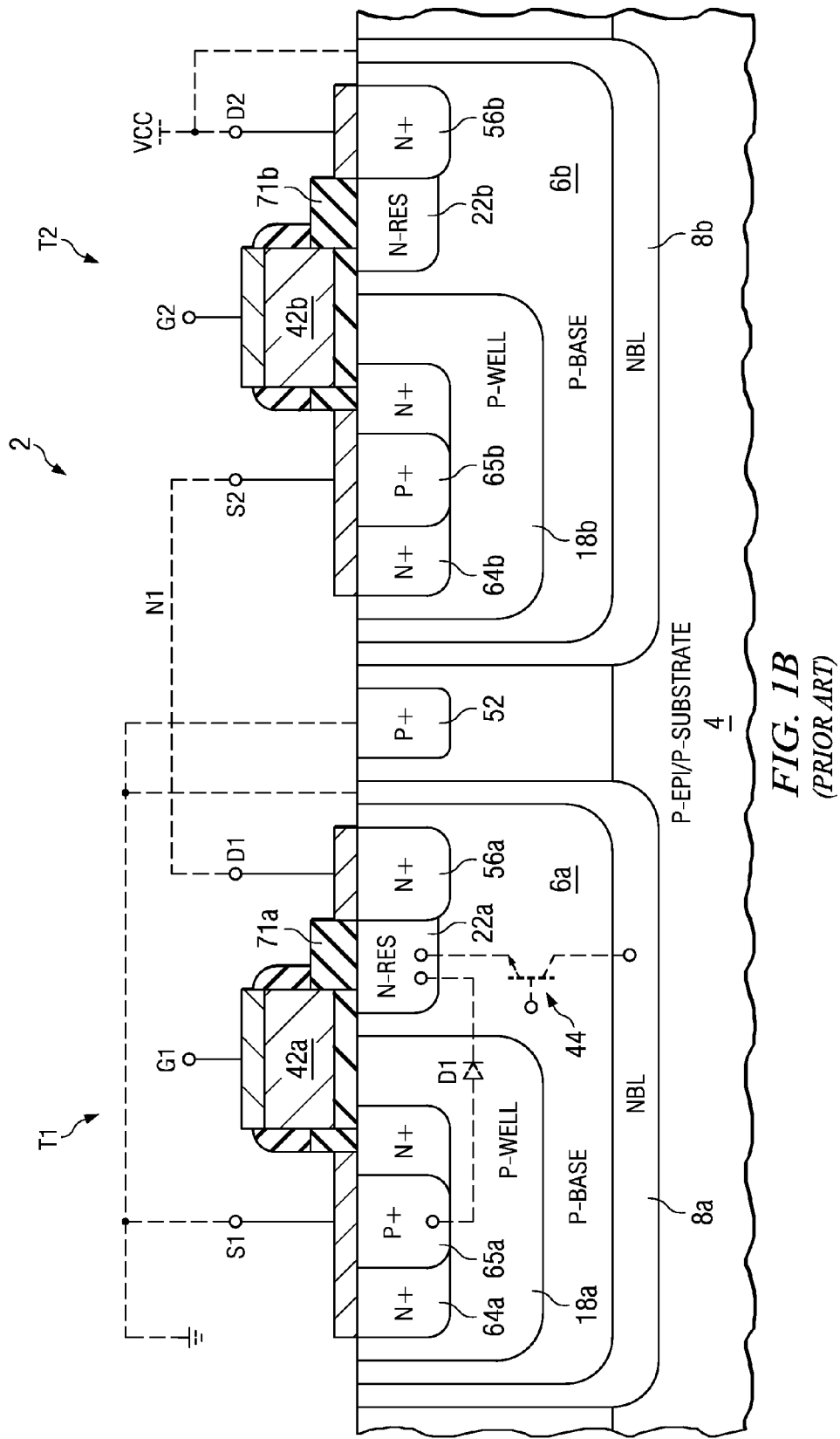
FIG. 1B is a partial side elevation view in section illustrating one pair of high and low-side DEMOS transistors in the circuit device of FIG. 1A.
Figure 3:
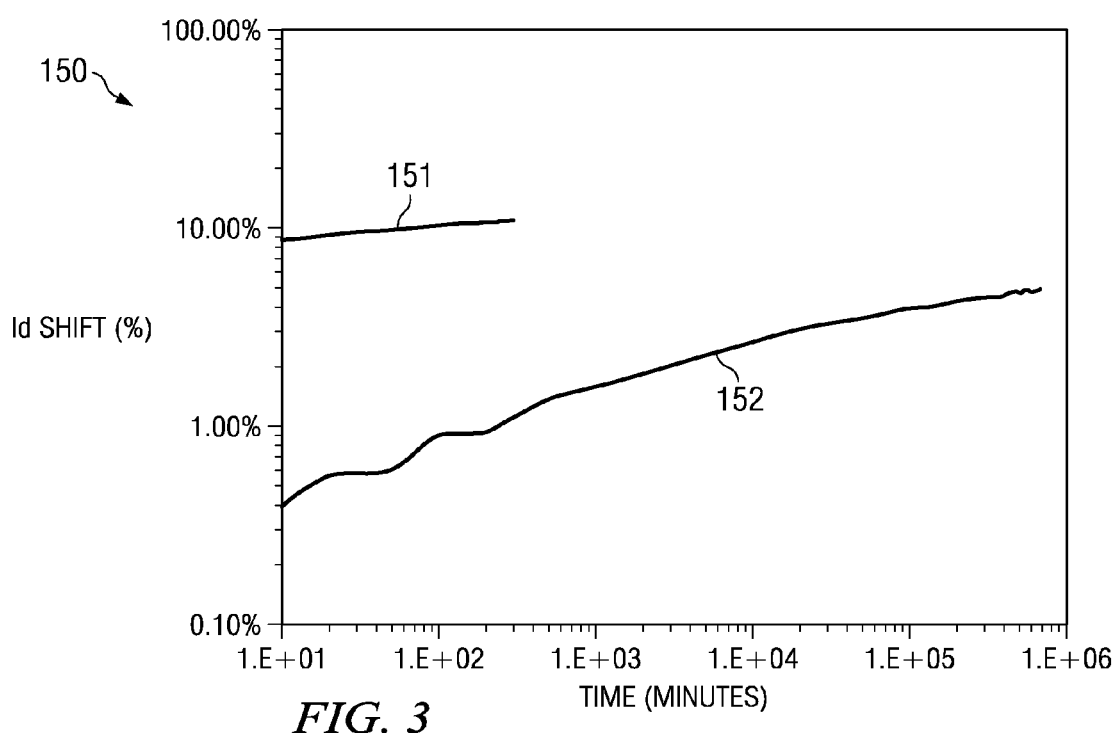
FIG. 3 is a plot illustrating drain current shift vs. time curves for a conventional low side DENMOS drive transistor in the device of FIGS. 1A and 1B and the exemplary DENMOS transistor of FIGS. 2A and 2B.

Referring also to FIG. 3, with respect to reducing device parameter degradation due to hot carrier injection in the gate oxide 140 and improving device reliability, the conventional low side driver T1 in FIG. 1B suffers from significant degradation (shift) in drain current Id over time, whereby the useful service lifetime of the device 2 is limited. FIG. 3 illustrates a plot 150 showing drain current shift vs. time curves 151 and 152 for a conventional low side thin RESURF DENMOS drive transistor T1 in the device of FIGS. 1A and 1B, and the exemplary DENMOS transistor T of FIGS. 2A and 2B, respectively. The curves 151 and 152 were obtained by testing using the same worst case gate-source voltage Vgs, wherein the curve 151 corresponds to a drain-source voltage Vds of 9 V for the conventional isolated thin RESURF DENMOS transistor T1 (FIG. 1B), and the curve 152 corresponds to a drain-source voltage Vds of 16 V for the exemplary DENMOS transistor T of the present invention (FIGS. 2A and 2B).

As can be seen from the plot 150, the conventional devices cannot meet a design goal of less than 10% drain current shift for at least 10 year service lifetime, even for a lower Vds of 9 V. However, the modified drift region 122 of the present invention provides significantly better reliability with well below 10% drain current shift for at least 10 year service lifetime at a higher Vds of 16 V. The addition of the first drift region portion 122a having controlled or optimized position vs. depth profile and doping concentration provides a robust connection between the inversion channel of the p-well 118 and the drift region 122 that mitigates Id degradation. Further, while the lateral extension of the first portion 122a by the distance 134 in FIG. 2B causes increased gate-drain capacitance Cgd, this region of the exemplary transistor T depletes at a relatively low voltage and therefore does not cause a significant increase in overall gate charge loss, while the lateral extension tends to mitigate damage due to hot carrier injection.

Thus, the drain-extended transistors of the present invention can provide significant performance and reliability improvements over conventional devices. While the above-described transistor T is an NMOS transistor, the various aspects of the invention are also applicable to PMOS transistors, wherein similar results are expected for extended-drain PMOS devices in which n-doped regions are replaced with p-doped regions and vice-versa. Moreover, the transistors of the invention may be fabricated using any suitable processing techniques.

Referring now to FIGS. 4 and 5A-5H, other aspects of the invention relate to methods of fabricating DEMOS transistors having drift regions comprising first and second portions, in which the first portion has a higher dopant concentration than the second portion, and/or in which the first portion extends beneath the gate structure by about 0.5 um or more. The methods involve forming a first portion of a drift region of a first conductivity type to a first depth in the semiconductor body, and oppositely doping an area under the first portion. A gate structure is formed with a first lateral end that extends at least partially over the first portion of the drift region, and a second (more lightly doped) drift region portion is formed that connects to the first portion to a drain, where the second drift region portion has a second depth.

Figure 4:
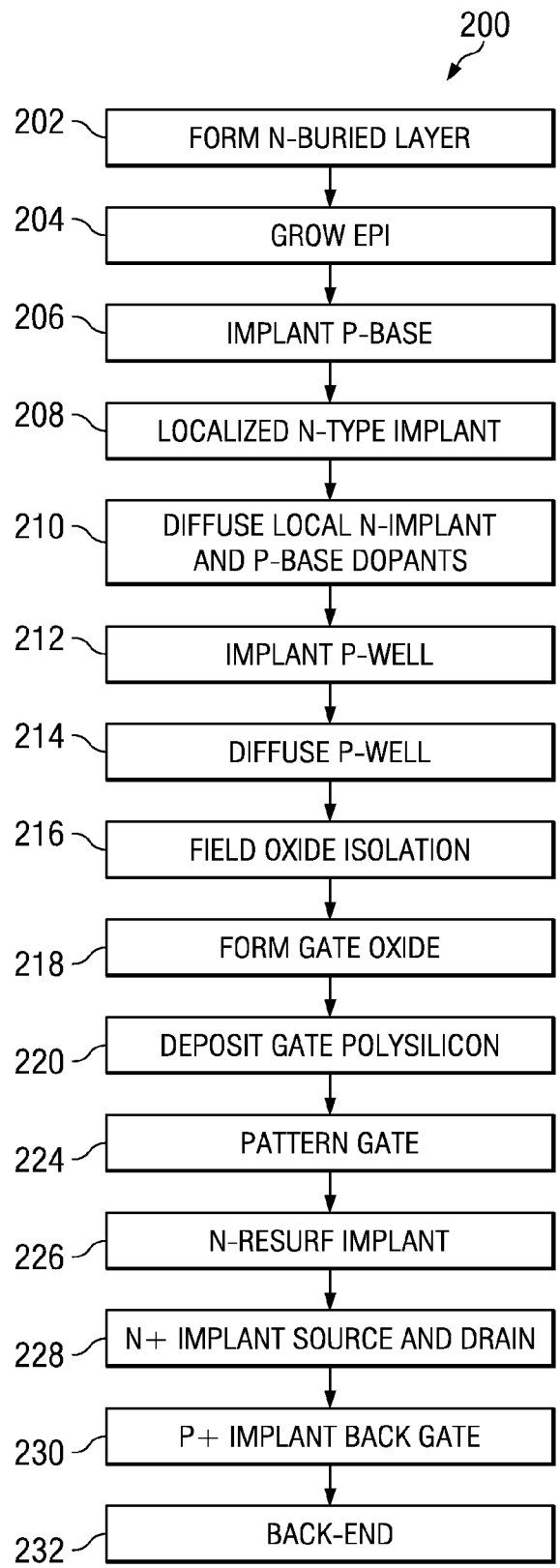
FIG. 4 is a flow diagram illustrating an exemplary method of fabricating an extended drain MOS devices in accordance with one or more aspects of the invention.

An exemplary method 200 is illustrated in FIG. 4 for fabricating extended-drain transistors in accordance with these aspects of the invention, and the above-described DENMOS transistor 102 is illustrated in FIGS. 5A-5H at various stages of fabrication in accordance with the invention. While the exemplary method 200 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of devices which are illustrated and described herein as well as in association with other devices and structures not illustrated.

Figure 5A:
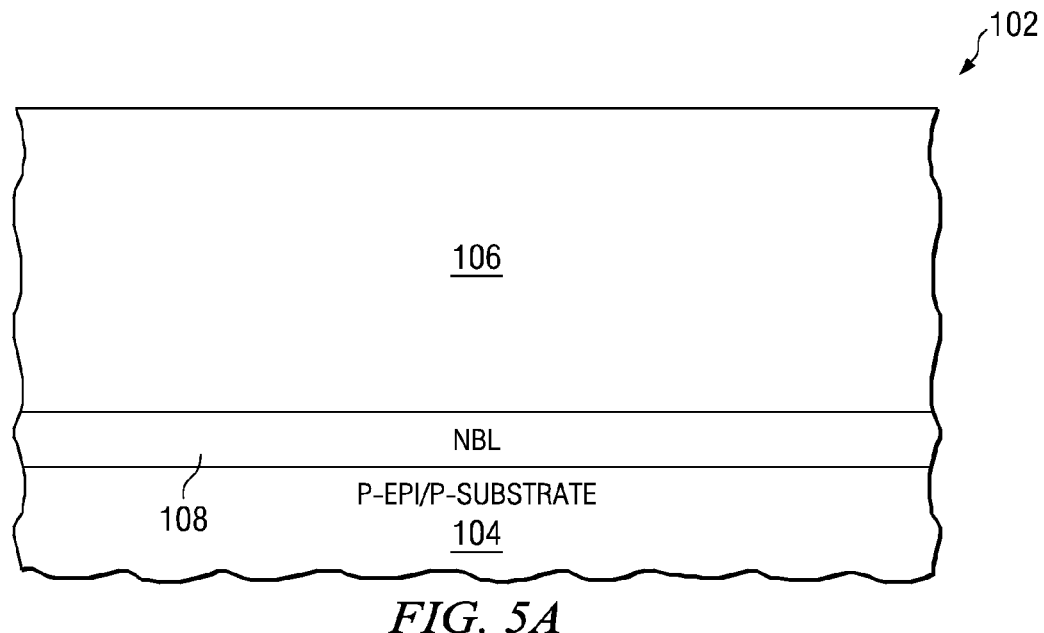
FIGS. 5A-5H are partial side elevation views in section illustrating the exemplary DENMOS transistor of FIGS. 2A and 2B at various stages of fabrication in accordance with the invention.

The method 200 is illustrated for the case of an n-channel DEMOS device, such as the transistor T of FIGS. 5A-5H, although the invention is also applicable to fabricating p-channel DEMOS devices with n-doped regions being substituted for p-doped regions and vice-versa. At 202, an n-buried layer is formed in a semiconductor body, such as the buried layer 108 formed in a p-type silicon substrate 104 of the device 102 (FIG. 5A). An epitaxial layer is grown at 204 to any suitable depth, for example, a p-type epitaxial layer 106 in FIG. 5A is formed to a thickness of about 4 to 10 um. A p-base implant is then performed at 206, wherein a mask 302 is formed in FIG. 5B that covers the semiconductor body surface above a prospective first drift region portion. An implantation process 304 is then performed with the mask 302 in place, so as to provide p-type dopants to portions laterally outward from an area below the prospective first drift region portion (e.g., to P-BASE portions 106 in FIG. 5B) at a depth greater than the target depth for the first drift region portion 122a (e.g., below the depth 130 in FIG. 2B).

Figure 5B:
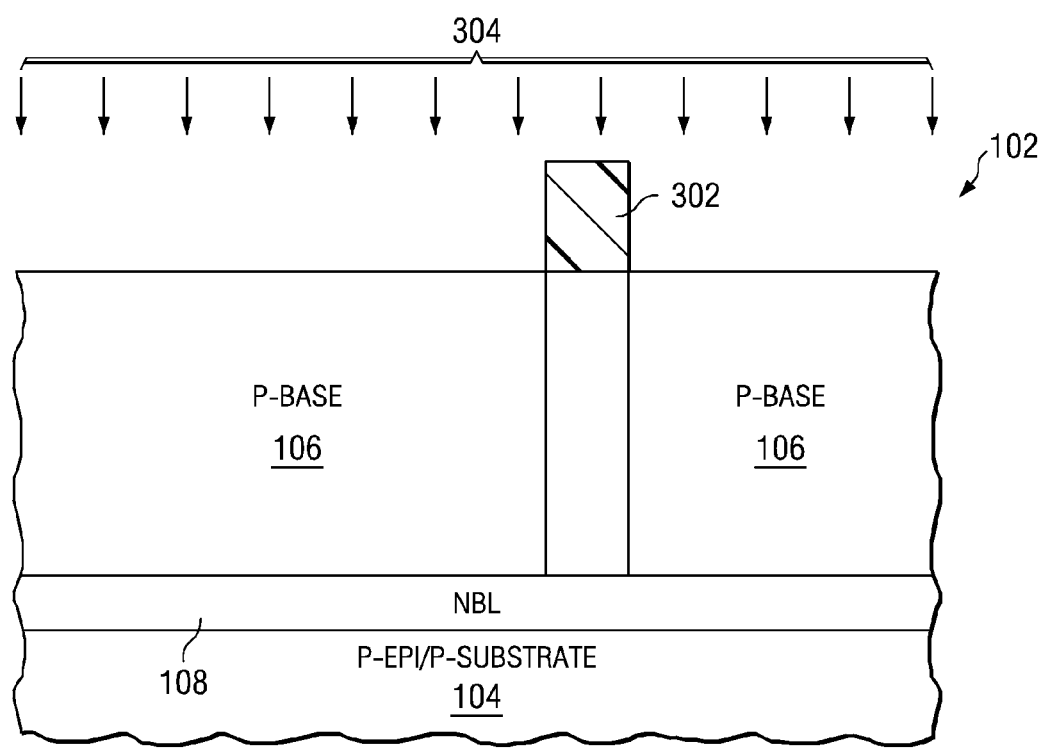
Figure 5C:
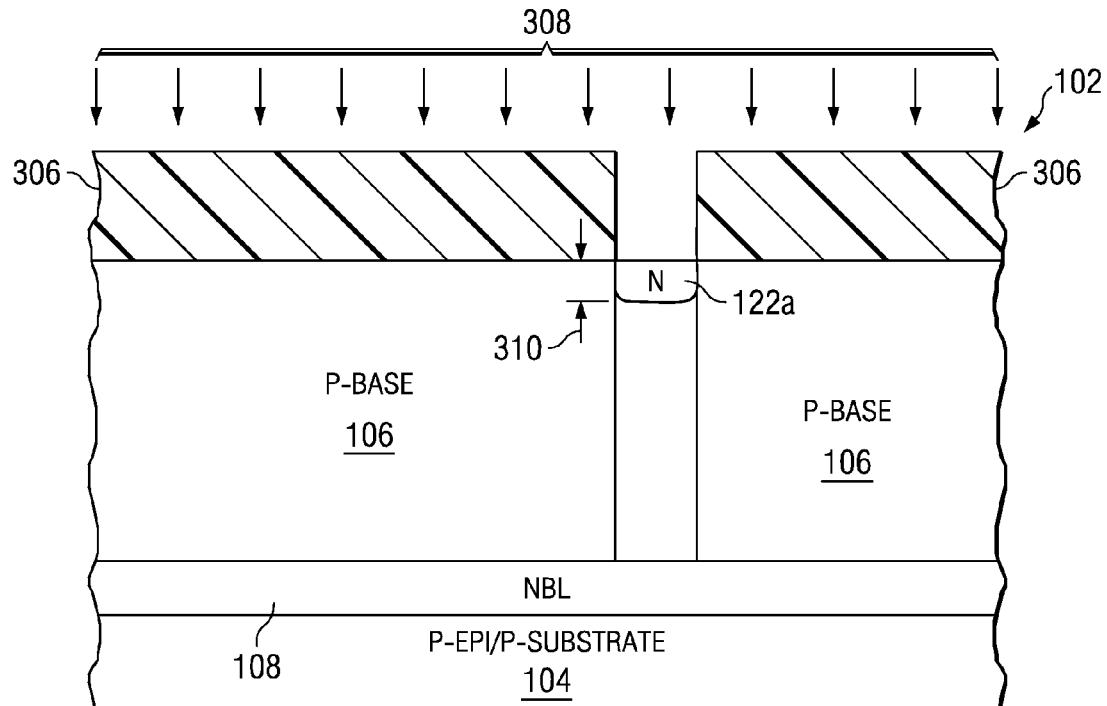

At 208, n-type dopants are provided to at least part of the first drift region portion 122a. As shown in FIG. 5B, a second implant mask 306 is formed, which exposes the prospective first portion 122a, and through which n-type dopants are implanted via an implantation process 308 to an implantation depth 310 that is less than the desired first depth 130. In device 102 of FIG. 5C, arsenic and/or phosphorus are implanted, wherein any suitable dopants, implantation energies, and dose may be employed to provide n-type dopants in the portion 122a at a higher concentration than the subsequently formed second drift region portion 122b.

Figure 5D:
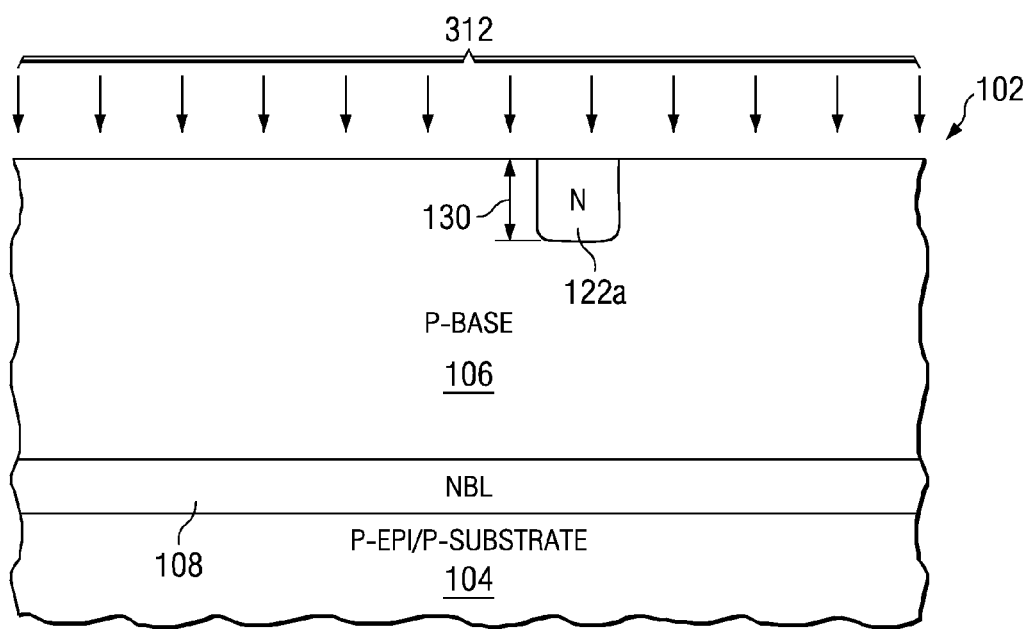

The device is annealed at 210 to diffuse the local n-type implanted dopants in the first portion 122a as well as the p-type dopants of the p-base 106. As illustrated in FIG. 5D, a thermal anneal process 312 is performed that drives or diffuses at least some of the n-type dopants in the portion 122a to the first depth 130 and concurrently diffuses some of the p-base dopants laterally into the area below the first portion 122a.

In the exemplary method 200, a single anneal is performed at 210 after the local n implant at 210 and the p-base implant at 208. In this implementation, the p-base dopants provide a corridor extending laterally around the first drift region portion 122a to inhibit out-diffusion of the n-type drift region dopants, thereby controlling the lateral spatial extent or shape of the portion 122a. In addition, the deeper p-base dopants will diffuse laterally into the area beneath the portion 122a, so as to pinch-off the downward diffusion of the n-type dopants, thereby controlling the ultimate depth 130 of the portion 122a and preventing shorting of the drift region 122 with the n-buried layer 108. However, the provision of the p-base dopants and the first n-drift region dopants may be accomplished by other processes, wherein the methods of the invention are not limited to the specific implementation of FIGS. 4 and 5A-5H. For example, separate anneals may be used to diffuse the p-base and n-drift region dopants, and the implants at 206 and 208 may be performed in any order.

Figure 5E:
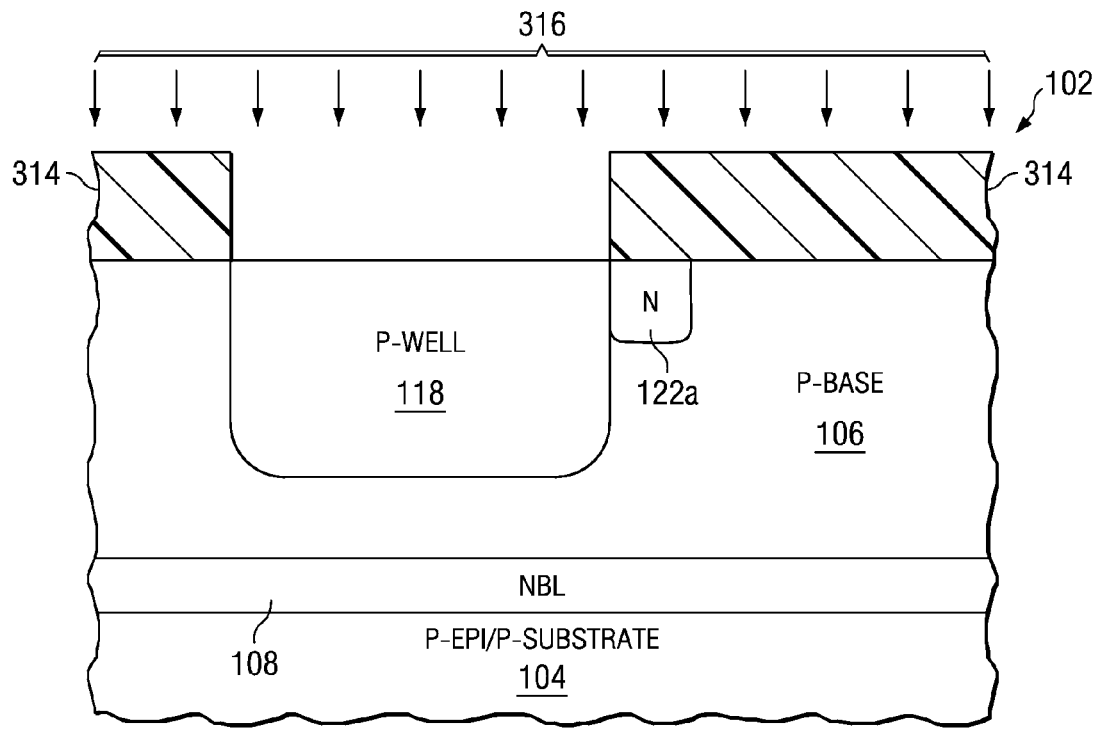

At 212, a p-well or p-body 118 is formed to provide p-type dopants in a channel region, as well as around a prospective source/back-gate in the p-base region 106 of the semiconductor body 104. In FIG. 5E, a mask 314 is formed and p-type dopants are implanted via an implantation process 316, which may be followed by another diffusion anneal at 214 (not shown in FIG. 5E) to form the exemplary p-well 118 extending to a depth of about 1-1.5 um within the p-base 106. The p-well 118 may, but need not, extend laterally to the first drift region portion 122a, and may extend to any suitable depth within the scope of the invention, typically deeper than the first depth 130.

Figure 5F:
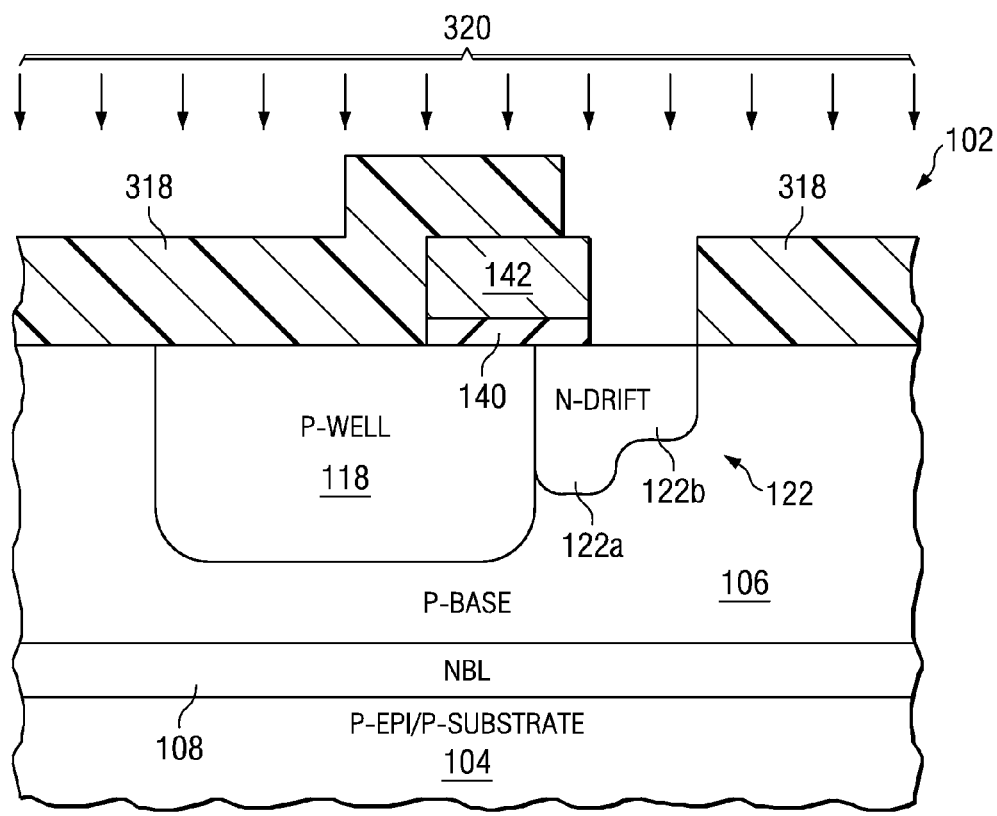

At 216, isolation structures are then formed, such as field oxide formed using LOCOS techniques or shallow trench isolation (STI) structures (not shown in FIG. 5E) or any other suitable method. A patterned gate structure is then formed at 218-224, as shown in FIG. 5F. In the illustrated example, a thin gate dielectric 140 is formed over the wafer surface at 218, for example, by thermal oxidation processing, and a gate polysilicon layer 142 is deposited at 220. The gate dielectric 140 and the polysilicon 142 are then patterned at 224 to form a gate structure having first and second lateral ends.

An n-RESURF implant is then performed at 226 to form a second drift region portion 122b, as shown in FIG. 5F. A mask 318 is formed to expose a portion of the wafer surface extending from the gate outward to a prospective drain region, and an implantation process 320 is used to implant n-type dopants to the second drift region portion 122b. Any technique may be used to provide the second drift region portion dopants within the scope of the invention. In one particular example, phosphorus is implanted at 226 using a dose of about 2E12-5E12 cm$^{-3}$ at an implantation energy of about 160 keV to provide a shallow second drift region portion 122b extending below the wafer surface by about 0.2 to 0.4 um.

Figure 5G:
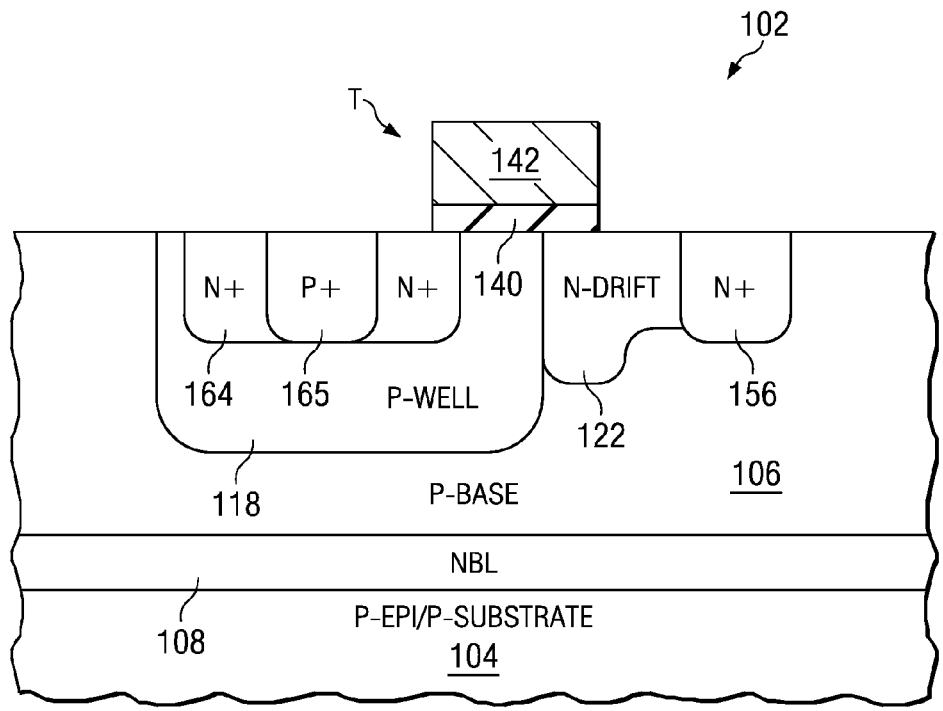
Figure 5H:
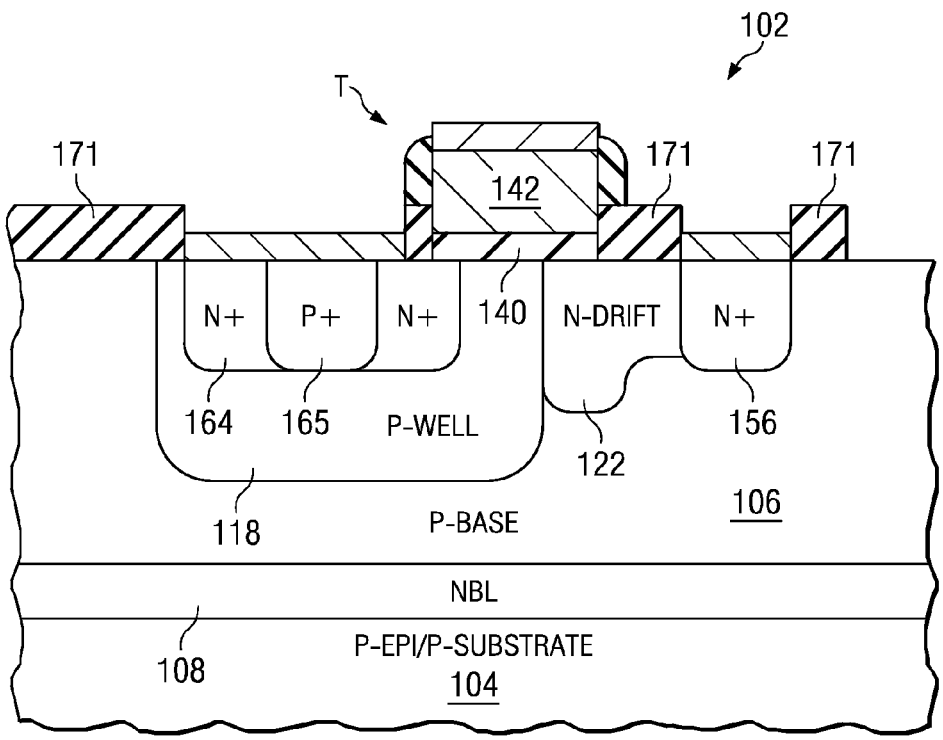

Following the n-RESURF implant at 226, n and p-type dopants are selectively implanted at 228 and 230 using suitable masks and implantation processes to form the n-type source 164 and drain 156, as well as the p-type back-gate contact 165, as shown in FIG. 5G. A source/drain implant at 228 provides n-doped source and drain regions 164 and 156, respectively, wherein the source 165 is formed in the p-well 118 and the drain 156 is formed at the second end of the drift region 122. The back-gate contact region 165 of the p-well 118 is then implanted at 230, wherein appropriate masks are used for the implantations at 228 and 230. Back-end processing is then performed at 232 to complete the fabrication process 200, wherein sidewall spacers are formed along the lateral ends of the gate structure, silicide contacts are formed (FIG. 5H) and metalization processing is performed to provide a multi-level interconnect routing structure (not shown in FIG. 5H).

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A drain-extended MOS transistor, comprising:
   a gate structure having first and second lateral ends formed over a channel region of a semiconductor body;
   a drift region of a first conductivity type formed in the semiconductor body, the drift region comprising a first portion having a first depth located at a first lateral end of the drift region and a second portion having a second depth located at a second opposite lateral end of the drift region, the first portion extending at least partially under the first lateral end of the gate structure;
   a channel of a second opposite conductivity type extending at least partially under the gate structure;
   a source of the first conductivity type proximate the second end of the gate structure; and
   a drain of the first conductivity type connected to the second lateral end of the drift region in the semiconductor body, the drain being spaced laterally from the first end of the gate structure;
   wherein the first portion of the drift region comprises a first concentration of dopants of the first conductivity type at a given depth less than the second depth, wherein the second portion of the drift region comprises a second concentration of dopants of the first conductivity type at the given depth, and wherein the first concentration is greater than the second concentration.

2. The transistor of claim 1, wherein the first depth of the first portion of the drift region is greater than the second depth of the second portion of the drift region.

3. The transistor of claim 2, wherein the first depth is about 0.7 um or more.

4. The transistor of claim 2, comprising a well of the second conductivity type extending at least partially under the gate structure to form the channel, wherein the first depth is less than or equal to a depth of the well.

5. The transistor of claim 1, wherein the first portion of the drift region extends at least partially under the first lateral end of the gate structure by a first lateral distance, the first lateral distance being about 0.5 um or more.

6. The transistor of claim 5, wherein the first lateral distance is about 0.6 um or more and about 1.0 um or less.

7. The transistor of claim 5, wherein the first depth of the first portion of the drift region is greater than the second depth of the second portion of the drift region.

8. The transistor of claim 7, wherein the first depth is about 0.7 um or more.

9. The transistor of claim 7, comprising a well of the second conductivity type extending at least partially under the gate structure to form the channel, wherein the first depth is less than or equal to a depth of the well.

10. The transistor of claim 1, wherein the first conductivity type is n-type and the second conductivity type is p-type.

11. The transistor of claim 10, further comprising:
    a p-type base region formed in the semiconductor body below the channel, the source, the drain, and the drift region; and
    an n-type buried layer formed below the base region.

12. The transistor of claim 1, further comprising:
    a base region of the second conductivity type formed in the semiconductor body below the channel, the source, the drain, and the drift region; and
    a buried layer of the first conductivity type formed below the base region.

13. The transistor of claim 1, wherein the first concentration is about $4.5E16$ cm$^{-3}$ or more at a depth of about 0.4 um or more.

14. The transistor of claim 1, wherein a portion of the semiconductor body under the first portion of the drift region is of the second conductivity type having a concentration of dopants of the second conductivity type of about $4E16$ cm$^{-3}$ or more.

15. A drain-extended MOS transistor, comprising:
    a gate structure having first and second lateral ends formed over a channel region of a semiconductor body;
    a drift region of a first conductivity type formed in the semiconductor body, the drift region comprising a first portion having a first depth located at a first lateral end of the drift region and a second portion having a second depth located at a second opposite lateral end of the drift region, the first portion extending at least partially under the first lateral end of the gate structure;
    a channel of the second opposite conductivity type extending at least partially under the gate structure;
    a source of the first conductivity type proximate the second end of the gate structure; and
    a drain of the first conductivity type formed in the semiconductor body, the drain being spaced laterally from the first end of the gate structure and the drain being located outside the drift region;

wherein the first portion of the drift region extends at least partially under the first lateral end of the gate structure by a first lateral distance, the first depth of the first portion of the drift region being greater than the second depth of the second portion of the drift region.

16. The transistor of claim 15, wherein the first lateral distance is about 0.5 um or more.

17. The transistor of claim 16, wherein the first depth is about 0.7 um or more.

18. The transistor of claim 16, comprising a well of the second conductivity type extending at least partially under the gate structure to form the channel, wherein the first depth is less than or equal to a depth of the well.

19. The transistor of claim 15, wherein the first lateral distance is about 0.6 um or more and about 1.0 um or less.

20. The transistor of claim 19, wherein the first depth is about 0.7 um or more.

21. The transistor of claim 19, comprising a well of the second conductivity type extending at least partially under the gate structure to form the channel, wherein the first depth is less than or equal to a depth of the well.

22. The transistor of claim 15, wherein the first conductivity type is n-type and the second conductivity type is p-type.

23. The transistor of claim 22, further comprising:
a p-type base region formed in the semiconductor body below the channel, the source, the drain, and the drift region; and
an n-type buried layer formed below the base region.

24. The transistor of claim 15, further comprising:
a base region of the second conductivity type formed in the semiconductor body below the channel, the source, the drain, and the drift region; and
a buried layer of the first conductivity type formed below the base region.

25. The transistor of claim 15, wherein the first portion of the drain extension region comprises a first concentration of dopants of the first conductivity type at a given depth less than the second depth, the first concentration being about $4.5E16$ $cm^{-3}$ or more.

26. The transistor of claim 15, wherein a portion of the semiconductor body under the first portion of the drift region is of the second conductivity type having a concentration of dopants of the second conductivity type of about $4E16$ $cm^{-3}$ or more.

* * * * *